United States Patent
Beschnitt et al.

(10) Patent No.: US 10,418,992 B2
(45) Date of Patent: Sep. 17, 2019

(54) OPERATING UNIT FOR AN ELECTRICAL APPARATUS EMPLOYING BOTH TILT AND PIVOT SENSORS

(71) Applicant: Behr-Hella Thermocontrol GmbH, Stuttgart (DE)

(72) Inventors: Alexander Beschnitt, Herford (DE); Michael Steinkamp, Lippstadt (DE)

(73) Assignee: Behr-Hella Thermocontrol GmbH, Stuttgart (DE)

( * ) Notice: Subject to any disclaimer, the term of this patent is extended or adjusted under 35 U.S.C. 154(b) by 361 days.

(21) Appl. No.: 15/327,669

(22) PCT Filed: Jul. 8, 2015

(86) PCT No.: PCT/EP2015/065573
§ 371 (c)(1),
(2) Date: May 5, 2017

(87) PCT Pub. No.: WO2016/012241
PCT Pub. Date: Jan. 28, 2016

(65) Prior Publication Data
US 2018/0034463 A1    Feb. 1, 2018

(30) Foreign Application Priority Data

Jul. 22, 2014  (DE) .................. 10 2014 214 224

(51) Int. Cl.
*B60K 37/06* (2006.01)
*H03K 17/965* (2006.01)
(Continued)

(52) U.S. Cl.
CPC ............. *H03K 17/96* (2013.01); *B60K 35/00* (2013.01); *B60K 37/06* (2013.01); *H01H 23/04* (2013.01);
(Continued)

(58) Field of Classification Search
CPC .. H03K 17/96; H03K 17/9625; H03K 17/965; H03K 17/9618; H03K 17/9622;
(Continued)

(56) References Cited

U.S. PATENT DOCUMENTS 7,255,466 B2 *  8/2007  Schmidt ............... G07C 9/0069
                                                    200/314
7,373,036 B2 *  5/2008  Bateman ................ H01H 23/02
                                                    385/16
(Continued)

FOREIGN PATENT DOCUMENTS

DE    10 2012 22110 B3    5/2014
EP       1 988 441 A1    11/2008
WO    2013/153048 A1    10/2013

OTHER PUBLICATIONS

International Search Report and Written Opinion for corresponding Patent Application No. PCT/EP2015/065573 dated Sep. 29, 2015.

*Primary Examiner* — Vanessa Girardi
(74) *Attorney, Agent, or Firm* — Renner, Otto, Boisselle & Sklar, LLP (57) ABSTRACT

An operating unit for an electrical apparatus is provided with a housing, an operating strip and a support element arranged in the housing. The operating strip is mounted on the support element about a tilt axis extending transversely to the longitudinal direction of the operating strip. The support element is tiltable parallel to the longitudinal direction of the operating strip. The support element is elastically pre-stressed, into a pivot position, which is detected by a pivot position sensor. Two tilt detection sensors detect a tilting of the operating strip about the tilt axis when it is actuated. The operating unit is provided with a controller for receiving signals and determining the operating field on which a finger is applied with an actuating force required for adopting the (Continued)

pivot position of the support element and triggering the function associated with the determined operating field.

10 Claims, 4 Drawing Sheets

(51) Int. Cl.
*B60K 35/00* (2006.01)
*H01H 23/12* (2006.01)
*H03K 17/97* (2006.01)
*H03K 17/96* (2006.01)
*H01H 23/04* (2006.01)

(52) U.S. Cl.
CPC ............ *H01H 23/12* (2013.01); *H03K 17/965* (2013.01); *H03K 17/9625* (2013.01); *B60K 2370/131* (2019.05); *B60K 2370/139* (2019.05); *B60K 2370/1446* (2019.05); *H01H 2215/05* (2013.01); *H03K 2017/9706* (2013.01)

(58) Field of Classification Search
CPC ........... H03K 17/9647; H03K 17/9755; H03K 17/98; H03K 2017/9713; H03K 2017/972; B60K 2350/1036; B60K 37/06; H01H 23/30; G05G 1/04; G05G 11/00
See application file for complete search history.

(56) References Cited

U.S. PATENT DOCUMENTS

| | | | |
|---|---|---|---|
| 8,859,920 B2* | 10/2014 | Manullang | H05K 5/0017 |
| | | | 200/339 |
| 9,704,659 B2* | 7/2017 | Bleckmann | H01H 3/122 |
| 9,979,391 B2* | 5/2018 | Beschnitt | B60K 37/06 |
| 10,032,579 B2* | 7/2018 | Brudzynsky | H01H 23/006 |
| 10,106,101 B2* | 10/2018 | Wachinger | G06F 3/0488 |

\* cited by examiner

OPERATING UNIT FOR AN ELECTRICAL APPARATUS EMPLOYING BOTH TILT AND PIVOT SENSORS

The present patent application claims the priority of German Patent Application 10 2014 214 224.5 of Jul. 22, 2014 the disclosure of which is incorporated herein by reference.

The invention relates to an operating unit for an electrical apparatus which may in particular be a vehicle component e.g. a heating, ventilation or air conditioning system.

Operating units for electrical apparatuses are known in a wide variety of forms. In particular in the field of motor vehicles operating concepts have been established recently in which a strip-shaped operating element is movably supported, the element having a plurality of operating fields for triggering different functions of an apparatus when actuated manually, wherein a corresponding sensor system detects the contact position of a finger of a hand on the operating strip and it can thereby be determined which apparatus function has been selected. The sensor system may e.g. be formed by proximity or contact sensors which mostly operate capacitively. If e.g. for design reasons the entire operating strip comprises a metal operating surface or an operation is possible while wearing gloves, a capacitive sensor system cannot be implemented in the operating strip. Other concepts exist in which, by means of differential signals, bending force sensor systems or distance sensor systems at different positions of the support of the operating strip make it possible to determine the position of the finger of a hand when the operating strip is actuated, as is described e.g. in WO-A-2013/153048. The operating strip of the operating unit known from this document is held in a quasi rigid manner by a support element, wherein, when actuated manually, tilting moments act on the operating strip relative to an axis extending in parallel with the extension of the operating strip.

It is an object of the invention to provide an operating unit for an electrical apparatus in which it is possible to detect the position of the finger in a highly reliable and safe manner when an operating strip of the operating unit is actuated.

To achieve this object the invention provides an operating unit for an electrical apparatus, in particular for a vehicle component such as, for example, a heating, ventilation and/or air conditioning installation, the operating unit being provided with a housing having a front wall, an operating strip projecting beyond the front wall, the operating strip having an operating surface with a plurality of operating fields for triggering different apparatus functions, the operating fields being arranged side by side in the longitudinal direction of the operating strip and between two ends of the operating strip, a support element for the operating strip, which is arranged in the housing, wherein the operating strip is mounted on the support element about a tilt axis that extends transversely to the longitudinal extension of the operating strip, and wherein the support element is pivotable in at least one pivoting direction about a pivot axis that extends parallel to the longitudinal extension of the operating strip between a rest position into which the support element is elastically prestressed and a pivot position, at least one pivot position sensor for detecting the pivot position of the support element when the operating strip is actuated, two tilt detection sensors for detecting a tilting of the operating strip about the tilt axis when the operating strip is actuated by manually pressing against an operating field of the operating strip, wherein the tilt detection sensors detect a movement of the ends of the operating strip when the same is actuated, and an evaluation and control unit for receiving the signals of the pivot position sensor and the tilt detection sensors and for determining, on the basis of the signals emitted by the tilt detection sensors, the operating field on which, upon manual operation of the operating strip, the finger of one hand is applied with an actuating force required for adopting the pivot position of the support element and for triggering the apparatus function that is associated with the determined operating field.

The operating unit of the present invention comprises an operating strip arranged on the front wall of a housing. Here, the operating strip is supported to be tiltable at the centre or bendable about its centre with respect to the longitudinal direction. In other words: the operating strip is connected with a support element arranged in the housing via a tilt axis or a torsion axis. The ends of the operating strip arranged on either side of this axis are substantially free to move. The operating strip has a plurality of operating fields which together form the operating surface of the operating strip. Each operating field is associated with the triggering of one apparatus function. If, for example, a finger of a hand is used to press one of the operating fields of the operating strip or if the operating strip is "pulled" upwards in the region of this operating field, the torque or the flexural moment acting on the operating strip is a function of the distance of the respective operating field that is engaged by the finger of a hand. Tilt detection sensors detect potential movements of the operating strip at the ends thereof or detect moments acting at the ends of the operating strip. In this regard, the term "tilt detection sensor" does not necessarily mean that a movement of an end of the operating strip or a tilting of the operating strip is detected; rather, it is detected which moments act on the operating strip when it is actuated. Nevertheless, it is also possible to detect a tilting movement of the operating strip, if the same is designed for this purpose.

For a reliable detection of the finger contact position on the operating field of the operating strip, the signals of the tilt detection sensors have to be evaluated in the instant in which a predefined minimum actuation force acts on the operating strip. According to the invention this is achieved by the fact that the unit formed by the support element and the operating strip is pivotable about a pivot axis from a rest position into at least one pivot position or into a pivot position located in at least one pivoting direction. The supporting element is mechanically prestressed into the rest position. To move from the rest position into the at least one pivot position a defined minimum actuation force must be exerted on the operating strip. The pivot axis extends transversally with respect to the tilt axis. If a pivot position sensor detects that the support element has adopted the pivot position, the torques or tilting moments acting on the operating strip, or also the tilting movements, are instantaneously detected by an evaluation and control unit, the detection being effected via the tilt detection sensors. The greater a torque detected by a tilt detection sensor or the greater a tilting of the operating strip detected by a tilt detection sensor, the farther away from the tilt axis a finger of the hand must rest on the operating strip. In this manner it is possible to perform a localization of the finger contact point on the operating surface of the operating strip.

The above description of the invention has been made under the aspect that the tilt axis is arranged between the ends of the operating strip, i.e. substantially at the centre of the operating strip. However, it is also conceivable that the operating strip is tiltable at one side, i.e. tiltably supported at one of its ends. In this case, the operating strip essentially acts in the manner of a cantilever.

The operating strip may be made from such a material (generally a plastic material) that it is slightly deformed elastically when actuated manually, i.e. when pressed by a finger of the hand, which in the ideal case, however, is not optically discernible. Other materials for the operating strip are also conceivable. It is feasible for the operating strip to be surface-coated, and thus finished, at least in the region of its operating field. In this case the entire operating strip creates the impression of a high-quality strip which may be advantageous depending on the design requirements.

However, it is the suspension (connection) of the operating strip at the support element that is decisive for the invention; this suspension/connection is elastically deformable and may be referred to as a torsion spring or a similar torsion element. If an ideally rigid operating strip is suspended from a torsion element, a certain degree of freedom (i.e. rotation) is allowed thereby, so that, in an idealized manner, the torsion element may be seen as a pivot bearing. Due to the ideally rigid operating strip no elastic deformation occurs in the strip. In this respect, the relation applies that the larger the lever (which operating field is pressed?), the greater the torsional moment of the torsion element. Seen in an idealized manner, depending on the lever length, a different reaction force/displacement is thus generated at the tilt detection sensors that are arranged at a distance from the torsion element.

When the operating strip is made of plastic material for example and is therefore not ideally rigid, a certain inherent elasticity of the operating strip is obtained in addition. However, this elasticity is not decisive for the tilt detection sensors. All that is of interest according to the invention is the torque of the torsion element provided via the torsion element, whereby a rotation of the operating strip becomes possible. In this regard, a maximum possible rigidity of the operating strip is desirable so that the moment is transmitted for the greater part to the positions of the tilt detection sensors instead of being transformed into a deformation of the operating strip itself which would result in the generation of weaker signals at the sensors.

Accordingly, it is the basic idea of the concept underlying the invention to be generally independent of a bending of the operating strip, although, however, such an inherent elasticity of the operating strip can nevertheless be tolerated. The concept of the invention allows for a very precise finger contact position on an operating strip having a plurality of operating fields. This requires no proximity sensor in the operating strip itself. Such sensor systems are mostly based on capacitive concepts, i.e. they cannot be realized in case of a continuously metalized operating surface. Moreover, in capacitive proximity sensor systems, an operation with a gloved hand is impractical. The concept of the invention lives on the torque of the operating strip that generates a torsional moment in a torsion axis. The torsion axis allows for this degree of freedom and thus also for the generation of torques at the ends of the operating strip. Thus, the bending of the operating strip and the torsional moment in the torsion axis are independent from each other. The torsion element is twisted and allows for the rotation of the operating strip similar to an ideally rigid rocker that can rotate because of the torsion axis.

The position of the finger on the operating strip is concluded from a pattern detection (i.e. from the signals supplied by the two tilt detection sensors). Fewer sensors than operating fields are required, whereby the technical effort regarding the sensors is reduced.

The concept of the present invention can be combined with force sense/force feedback operating systems. In this regard it may be provided that upon the detection of an actuation of the operating strip, the operating strip is cause to perform forced mechanical movements to thereby provide the operator with a haptic/tactile actuation feedback. The at least one pivot position sensor serves to detect the actuation, so that it could be considered a force sense sensor. However, a force sense sensor could as well detect a minimum force which, upon an actuation, acts on the operating strip and/or the support element.

With respect to the localization of the finger the concept of the invention works independently of the rigidity of the operating strip (see above). The principle of the invention functions independently of design of the operating surface of the operating strip (electrically conductive/not electrically conductive). An operation with a gloved hand is possible without problems. A detection of a erroneous actuation (actuation of the operating strip between two operating fields or by simultaneous actuation of two operating fields that are symmetric with respect to the tilt axis) is also possible using the structure according to the invention.

In an advantageous development of the invention it may be provided that the operating strip has its ends connected with the support element via flexible webs and that the tilt detection sensors detect a bending of the flexible webs when the operating strip is tilted about the tilt axis.

It may further be feasible for the tilt axis to be formed as an elastic torsion axis.

In case of e.g. an operating strip connected at the centre in a tiltable/twistable manner, it is advantageous for a detection of the simultaneous actuation of two operating fields arranged on different sides of the tilt axis at the same distance from the tilt axis to provide a tilt axis sensor for the detection of a movement of the tilt axis in a normal movement direction extending perpendicularly to the tilt axis itself, as well as to the pivot axis. In case of this kind of erroneous actuation of the operating strip, the two tilt detection sensors would supply signals of substantially equal magnitudes. Without the sensor that detects flexural moments along the tilt axis, i.e. without the tilt axis sensor, it would thus not be possible to detect the erroneous actuation. Using the signal additionally supplied by the tilt axis sensor in this case, a erroneous actuation can thus be detected by the fact that this tilt axis sensor responds. If, however, the operating field is actuated that is arranged in the area of the tilt axis and relative to which the tilt axis is ideally centered, the tilt axis sensor, together with the signals of substantially equal magnitudes respectively supplied by the tilt detection sensors, provides a signal pattern from which it can be concluded that the respective operating field in the area of the tilt axis has been actuated.

For a detection of a flexural moment acting along the tilt axis it is advantageous for the tilt axis to be flexurally rigid with respect to flexural moments acting in the normal movement direction. This applies analogously to the case where the tilt axis is designed as a torsion axis.

In a further advantageous embodiment of the invention it may be provided that the torsion axis is designed as a connecting web which, similar to the flexible webs, protrudes to a common side from a transversal web, wherein the flexible webs and the connecting web are fixed to the support element and bear the operating strip.

Finally, it may be advantageous if, for reasons of its geometry, its material and/or the position of its connection with the support element and/or with the operating strip, the connecting rod is more rigid than the flexible webs and/or if the connecting webs and the flexible webs e.g. have the same geometry and are made of the same material, the connecting web is shorter than the flexible webs and/or has a shorter free bending length than the flexible webs, in particular due to the fact that the connecting web protrudes from the support element at a first connection point and the flexible webs protrude from the support element at a second connection point, with the second connection points being spaced farther from the operating strip than the first connection point.

As already mentioned above, the support element is pivotably supported. In order to be able to engage the operating strip in two opposite directions it is advantageous if the support element is pivotable from the rest position in two opposite pivot directions and thus into two opposite pivot positions, with the pivot position sensor detecting the respective pivot position adopted, or that two pivot position sensors are provided for the detection of a respective other one of the two pivot positions.

Further, it may advantageously be provided that each tilt detection sensor detects a movement of the respective end of the operating strip and/or a moment acting on the respective end of the operating strip in each of two opposite movement directions. In this regard it may further be useful if, in a rest position of the operating strip in which the operating strip is not actuated, every tilt detection sensor detects a prestressing of the respective flexible web, and that the movement direction of an end of the operating strip may be detected based on an increase or decrease of the signal of the tilt detection sensor outputted by this sensor when the operating strip is in the rest position.

According to a further useful embodiment of the invention it is possible that the sensors function capacitively, inductively, ohmically or optically or that they are designed as limit switches.

As already addressed above, it is advantageous if the tilt detection sensors detect an actuation of the operating strip both when the finger of a hand contacts the operating strip on the top or the bottom surface.

The invention will be explained in more detail hereunder with reference to embodiments and to the drawings. The Figures show.

Figure 1:
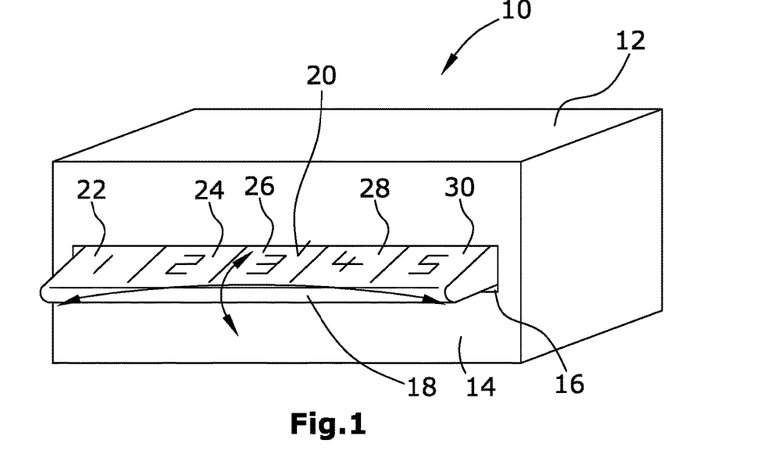
FIG. 1 a perspective front view of an operating unit according to an embodiment of the invention, FIG. 2 a perspective view of the "cut-open" operating unit of FIG. 1 to clearly illustrate the pivot bearing and the connection of the operating strip to a support element pivotably supported in the housing, FIG. 3 a top plan view on the cut-open housing according to the arrow III in FIG. 2, FIG. 4 a view similar to FIG. 3, but with an alternative embodiment of the tilt axis of the operating strip, FIG. 5 a perspective view of the combination of the support element and the operating strip according to the embodiment in FIG. 4, FIG. 6 an alternative embodiment of the combination of the support element and the operating strip, and FIG. 7 a schematic illustration, clarified by graphic elements, the different combinations of signal swings at the individual sensor elements.

FIG. 1 is a perspective front view of a simplified operating unit 10. The operating unit 10 has a housing 12 with a front wall 14 in which a cutout 16 is provided. An operating strip 18 protrudes through the cutout 16, the operating strip protruding beyond the front wall 14. The operating strip 18 has an operating surface 20 with a plurality of operating fields 22, 24, 26, 28 and 30 arranged side by side. The operating unit 10 generally comprises further operating elements and in particular also comprises indicating elements in the form of displays or other typical indicating elements, which, however, are not of importance to the present invention so that they will neither be described in detail herein, nor are they illustrated in the Figures.

Figure 2:
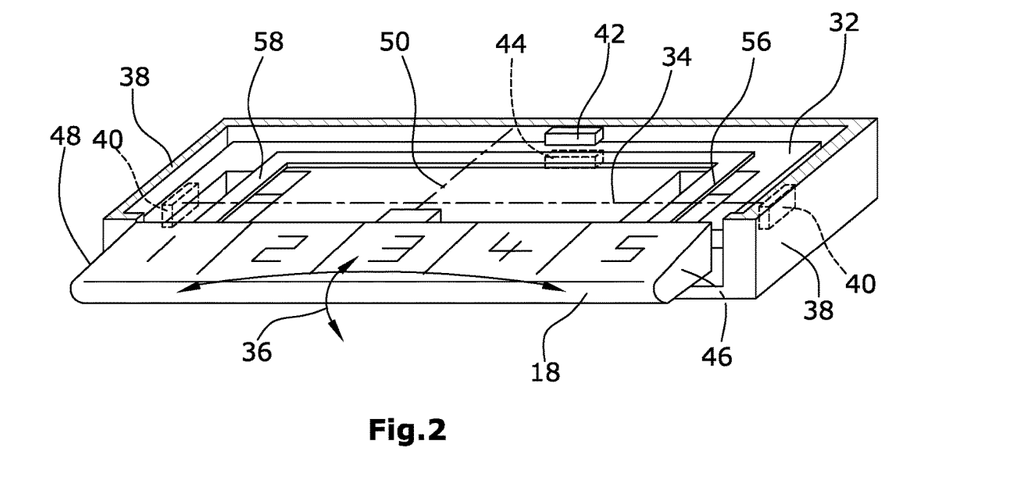
Figure 3:
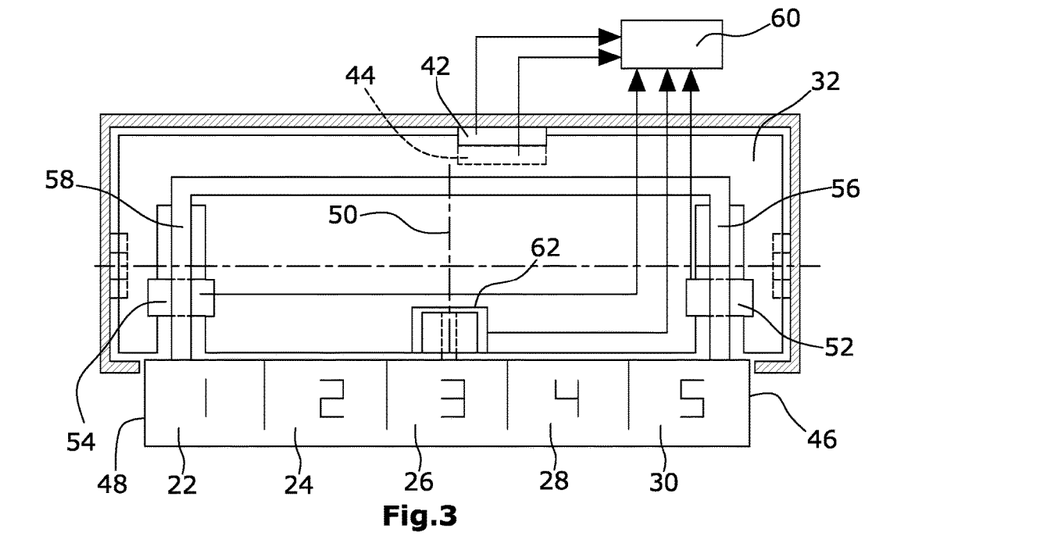

As can be seen in particular in FIGS. 2 and 3, the operating strip 18 is connected to a support element 32 arranged inside the housing 12. The support element 32 is substantially plate-shaped and is pivotable about a pivot axis 34 from a rest position into which the support element 32 is prestressed mechanically, into one of two pivot positions situated in opposite pivoting directions. The two pivoting directions are indicated by an arrow 36. Pivot bearing blocks 40 are provided in the area of the side walls 38 of the housing 12, the support element 32 being supported at these blocks so as to be pivotable about the pivot axis 34.

Pivot position sensors 42, 44 detect when one of the two pivot positions is adopted upon the actuation of the operating strip 18, said sensors also being arranged in the housing 12 in this embodiment (see FIG. 2).

The operating strip 18 has two ends 46, 48. The operating strip 18 is connected to the support element 32 in the centre between these two ends 46, 48 via a tilt axis or a torsion shaft 50 (e.g. a torsion spring). The operating strip 18 is substantially free at the two ends 46, 48. For this reason, when the operating strip 18 is actuated, torques of different magnitude act, depending on the contact position of a finger of a hand, which torques either result in different degrees of pivoting or in a tension in the operating strip 18. This is detected by two tilt detection sensors 52, 54 which detect flexural moments or movements acting on the ends 46, 48. In this embodiment this is effected by flexible webs 56, 58 protruding from the support element 32. These flexible webs 56, 58 act on the tilt detection sensors 52, 54 so that the degree of bending and also the direction of bending of the flexible webs 56, 58 is a measure of the deformation or the flexural moments acting on the operating strip 18 when the same is actuated.

As illustrated in FIG. 3 the two pivot position sensors 42, 44 are connected to an evaluation and control unit 60. The two tilt detection sensors 52, 54 are also connected to this evaluation and control unit 60. In addition, a further sensor 62 may be provided that detects flexural moments acting on the axis 50 when the operating strip 18 is actuated.

The localization of the contact point of a finger of a hand on the operating strip 18 during the actuation of the same is performed on the basis of the signals of the tilt detection sensors 52, 54. The farther away from the axis 50 the actuation force is exerted on the operating strip 18, the greater the torques are that act on the operating strip 18. In this context it has to be ensured that the signals of the tilt detection sensors 52, 54 are evaluated in the instant an effective actuation of the operating strip 18 is detected. The determination of this instant is achieved by means of the pivot position sensors 42, 44 that detect when one of the two pivot positions are adopted. In this instant the signals of the tilt detection sensors 52, 54 are evaluated and, by means of a recognition of these signal patterns, a conclusion can be made with respect to the operating field on which a finger of a hand rests when the operating strip 18 is actuated.

The additional sensor 62 makes it possible to detect erroneous actuations of the operating strip 18. If for example the two outer operating fields 22, 30 are pressed simultaneously, the two tilt detection sensors 52, 54 output substantially equal signals. Theoretically speaking this could also mean that a finger of a hand rests on the central operating field 26. Now, the signal of the tilt axis sensor 62 is evaluated in addition, which sensor, when a finger of a hand rests on the central operating field 26 while the signals of the tilt detection sensors 52, 54 are substantially equal, outputs a different signal than in the case in which two fingers rest simultaneously on the outer operating fields 22, 30.

Figure 4:
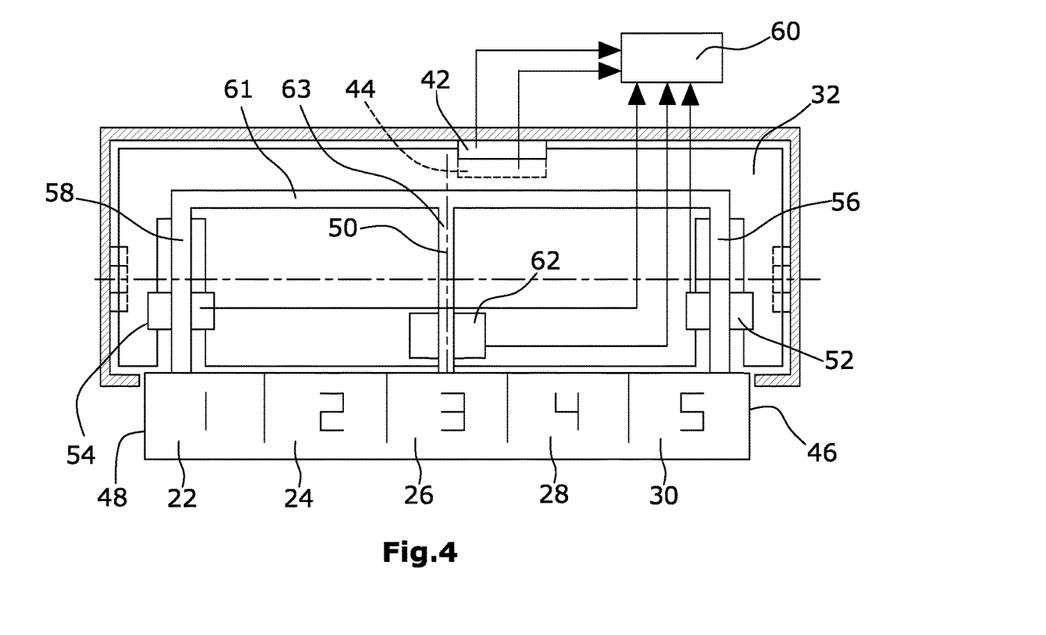
Figure 5:
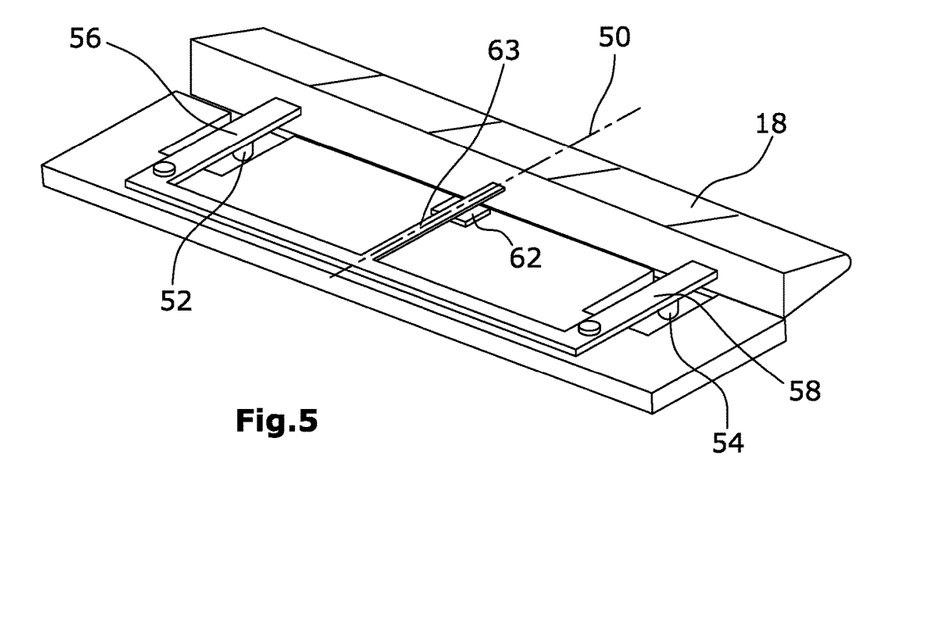

FIGS. 4 and 5 show an alternative embodiment of the invention in which the axis 50 is designed as a torsion spring formed as a connecting web 63. The connecting web 63 and the flexible webs 56, 58 extend from a transversal web 61. The remaining elements of the operating unit in FIGS. 4 and 5 are identical with those of the operating unit in FIGS. 1 to 3.

Figure 6:
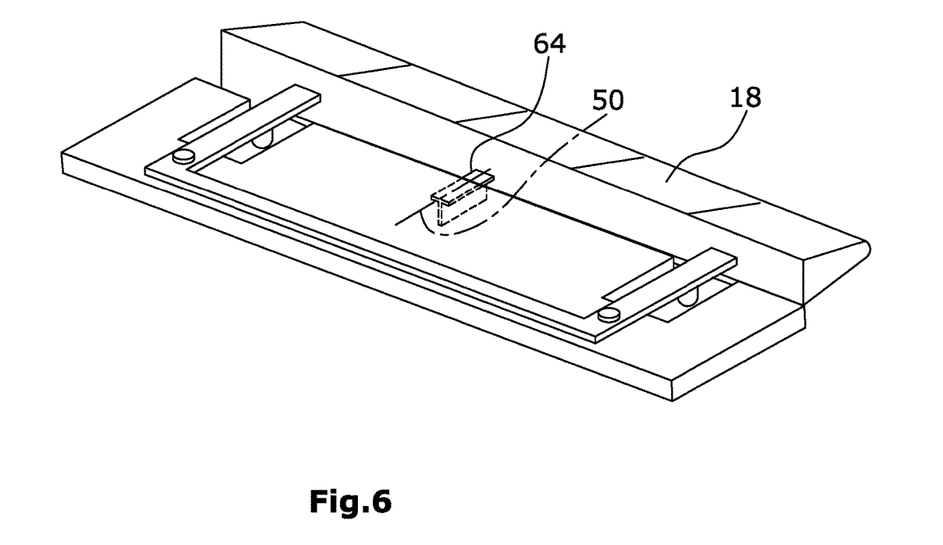

Finally, FIG. 6 illustrates still another embodiment of the invention in which the axis 50 is designed as a torsion spring 64 flexurally rigid along its extension. Again it applies that the other components of the operating unit of this embodiment are identical with those of the operating unit in FIGS. 1 to 3.

Figure 7:
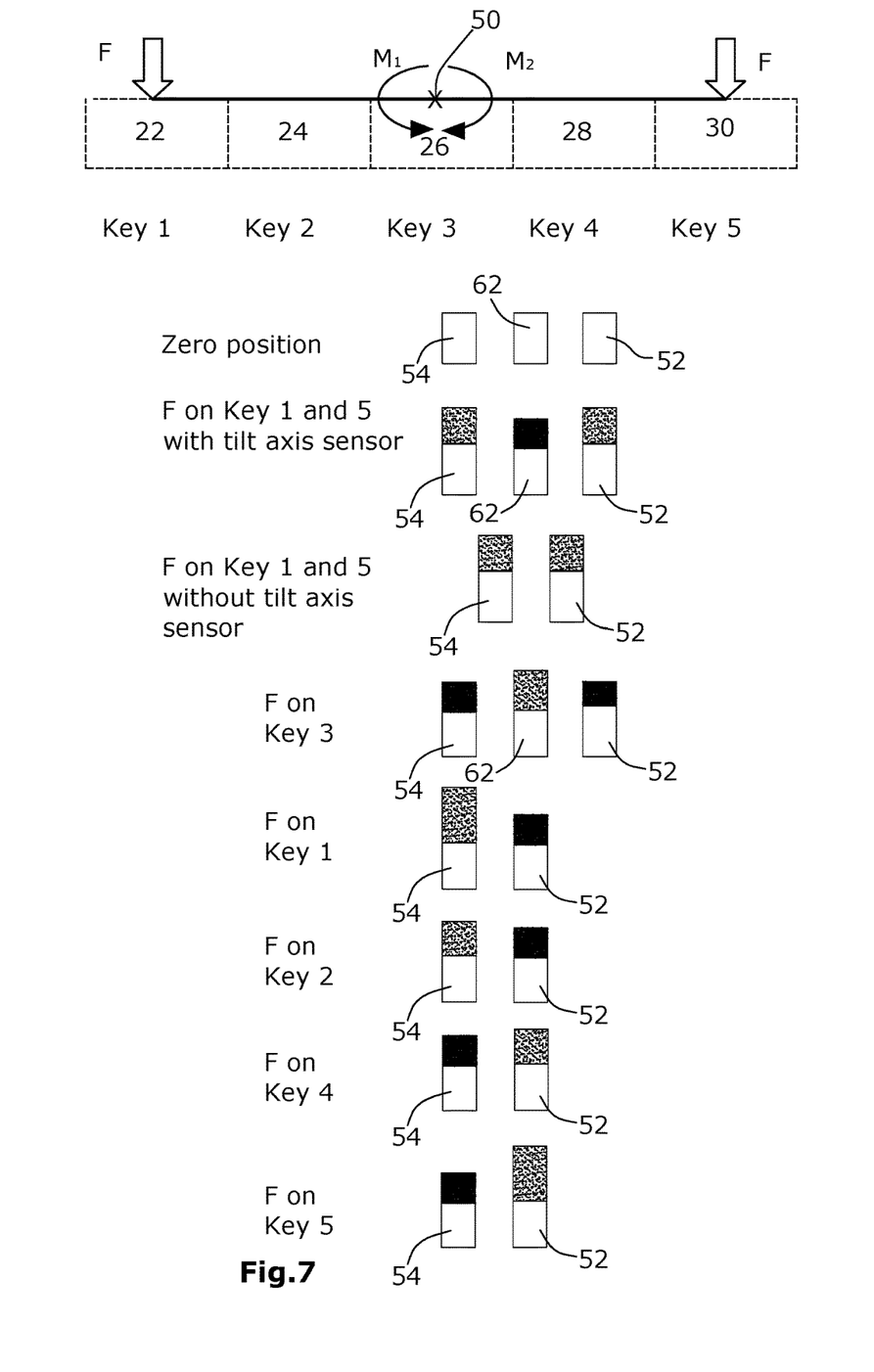

FIG. 7 again schematically illustrates the above described situation in which the position of the finger contact point on the operating strip 18 is concluded from the signals of the tilt detection sensors 52, 54 and the tilt axis sensor 62. In FIG. 7 the operating fields 22, 24, 26, 28, 30 are additionally labeled as "key 1" to "key 5". In a situation in which, due to erroneous actuation, the keys 1 and 5 (or alternatively the keys 2 and 4) are pressed simultaneously, the two tilt detection sensors 52, 54 detect substantially the same forces or moments so that their signals are substantially the same. The tilt axis sensor 62 also detects a signal which, however, is weaker. It is thereby detected that an erroneous actuation is given. Without this tilt axis sensor 62, an erroneous actuation would be impossible to detect.

If, in contrast, only the central key 3 is pressed, the signal of the tilt axis sensor 62 is larger than the signals of the two tilt detection sensors 52, 54, whereby an actuation of the operating strip 18 by a finger resting on key 3 is detected.

If e.g. key 1 is pressed, the signal of the tilt detection sensor 54 is larger than that of the tilt detection sensor 52. If key 2 is actuated, a difference can still be determined in this respect, although it is less than in the previous case. The situation is inversed correspondingly when key 4 or 5 is actuated.

LIST OF REFERENCE NUMERALS 10 operating unit
12 housing
14 front wall of the housing
16 cutout in the front wall
18 operating strip
20 operating surface of the operating strip
22 outer operating field
24 operating field
26 central operating field
28 operating field
30 outer operating field
32 support element
34 pivot axis of the support element
36 pivot directions
38 side walls of the housing
40 pivot bearing blocks
42 pivot position sensor
44 pivot position sensor
46 end of operating strip
48 end of operating strip
50 bending shaft, tilt axis
52 tilt detection sensor for the operating strip
54 tilt detection sensor for the operating strip
56 flexible web
58 flexible web
60 evaluation and control unit (controller)
61 transversal web
62 tilt axis sensor
63 connecting web
64 torsion spring

The invention claimed is:

1. An operating unit for an electrical apparatus, in particular for a vehicle component such as, for example, a heating, ventilation and/or air conditioning installation, the operating unit being provided with
   a housing having a front wall,
   an operating strip projecting beyond the front wall, the operating strip having an operating surface with a plurality of operating fields for triggering different apparatus functions, the operating fields being arranged side by side in a longitudinal direction of the operating strip and between two ends of the operating strip,
   a support element for the operating strip, which is arranged in the housing,
   wherein the operating strip is mounted on the support element about a tilt axis that extends transversely to the longitudinal direction of the operating strip, and
   wherein the support element is pivotable in at least one pivoting direction about a pivot axis that extends parallel to the longitudinal direction of the operating strip between a rest position into which the support element is elastically prestressed and a pivot position,
   at least one pivot position sensor for detecting the pivot position of the support element when the operating strip is actuated,
   two tilt detection sensors for detecting a tilting of the operating strip about the tilt axis when the operating strip is actuated by manually pressing against an operating field of the operating strip,
   wherein the tilt detection sensors detect a movement of the ends of the operating strip when the same is actuated, and
   a controller for receiving the signals of the pivot position sensor and the tilt detection sensors and for determining, on the basis of the signals emitted by the tilt detection sensors, the operating field on which, upon manual actuation of the operating strip, a finger of one hand is applied with an actuating force required for adopting the pivot position of the support element and for triggering the apparatus function that is associated with the determined operating field.

2. The operating unit of claim 1, wherein the operating strip has its ends connected with the support element via flexible webs and that the tilt detection sensors detect a bending of the flexible webs when the operating strip is tilted about the tilt axis.

3. The operating unit of one of claim 1, comprising a tilt axis sensor for the detection of a movement of the tilt axis in a normal movement direction extending perpendicularly to the tilt axis itself, as well as to the pivot axis.

4. The operating unit of claim 1, wherein the tilt axis is defined by an elastic torsion spring.

5. The operating unit of claim 4, wherein the torsion spring is flexurally rigid with respect to a bending in the normal movement direction.

6. The operating unit of claim 4, wherein the torsion spring is designed as a connecting web which, similar to the flexible webs, protrudes to a common side from a transversal web, the flexible webs and the connecting web being fixed to the support element and bear the operating strip.

7. The operating unit of claim 6, wherein for reasons of its geometry, its material and/or the position of its connection with the support element and/or with the operating strip, the connecting web is more rigid than the flexible webs.

8. The operating unit of claim 1, wherein the support element is pivotable from the rest position in two opposite pivot directions and thus into two opposite pivot positions, and that the pivot position sensor detects the respective pivot position adopted, or that two pivot position sensors are provided for the detection of a respective other one of the two pivot positions.

9. The operating unit of claim 8, wherein each tilt detection sensor detects a movement of the respective end of the operating strip and/or a moment acting on the respective end of the operating strip in each of two opposite movement directions.

10. The operating unit of claim 9, wherein, in a rest position of the operating strip in which the operating strip is not actuated, every tilt detection sensor detects a prestressing of the respective flexible web, and that the movement direction of an end of the operating strip may be detected based on an increase or decrease of the signal of the tilt detection sensor outputted by this sensor when the operating strip is in the rest position.

\* \* \* \* \*